United States Patent
Takahashi

(10) Patent No.: US 7,841,705 B2
(45) Date of Patent: Nov. 30, 2010

(54) ACTUATOR DEVICE, LIQUID-JET HEAD AND LIQUID-JET APPARATUS

(75) Inventor: Tomoaki Takahashi, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 770 days.

(21) Appl. No.: 11/765,755

(22) Filed: Jun. 20, 2007

(65) Prior Publication Data
US 2008/0012907 A1    Jan. 17, 2008

(30) Foreign Application Priority Data
Jun. 28, 2006    (JP) .............................. 2006-177663

(51) Int. Cl.
*B41J 2/045* (2006.01)
(52) U.S. Cl. ...................................... 347/68
(58) Field of Classification Search ............. 347/68–72; 310/328, 340
See application file for complete search history.

(56) References Cited

U.S. PATENT DOCUMENTS

| | | | |
|---|---|---|---|
| 6,611,014 B1 | 8/2003 | Kanaya et al. | |
| 6,616,270 B1 * | 9/2003 | Miyata et al. | 347/68 |
| 6,982,453 B2 | 1/2006 | Kanaya et. al. | |
| 7,164,179 B2 | 1/2007 | Nakanishi et al. | |
| 7,402,256 B2 | 7/2008 | Matsuzawa et al. | |

FOREIGN PATENT DOCUMENTS

| | | |
|---|---|---|
| JP | 2000-263785 A | 9/2000 |
| JP | 2001-036026 | 2/2001 |
| JP | 2002-299579 | 10/2002 |
| JP | 2003-127366 A | 5/2003 |
| JP | 2005-144804 A | 6/2005 |
| JP | 2006-088665 A | 4/2006 |
| JP | 2006-159410 A | 6/2006 |
| WO | WO 2004/015370 | 2/2004 |

* cited by examiner

*Primary Examiner*—An H Do
(74) *Attorney, Agent, or Firm*—Sughrue Mion, PLLC

(57) ABSTRACT

Provided is an actuator device including piezoelectric elements which are displaceably provided on a substrate. Each piezoelectric element is formed of a lower electrode, a piezoelectric layer and an upper electrode. In the actuator device, longitudinal end portions of the upper electrode define longitudinal end portions of a piezoelectric active portion to be a substantial driver of the piezoelectric element. The lower electrode and the piezoelectric layer are provided continuously to the longitudinal outside of the piezoelectric active portion. Regions of the piezoelectric layer outside of the piezoelectric active portion are formed so that thin film portions may have a thin thickness.

12 Claims, 9 Drawing Sheets

ACTUATOR DEVICE, LIQUID-JET HEAD AND LIQUID-JET APPARATUS

The entire disclosure of Japanese Patent Application No. 2006-177663 filed Jun. 28, 2006 is expressly incorporated by reference herein.

BACKGROUND

1. Technical Field

The present invention relates to an actuator device including piezoelectric elements displaceably provided on a substrate. The invention also relates to a liquid-jet head and a liquid-jet apparatus provided with the actuator device as liquid jetting means for jetting liquid from nozzle orifices.

2. Related Art

As a piezoelectric element used for an actuator device, there is one constituted by interposing, between an upper electrode and a lower electrode, a piezoelectric layer made of a piezoelectric material exhibiting an electromechanical transduction function. An example of such piezoelectric materials is crystallized piezoelectric ceramic. Such an actuator device is generally called an actuator device of flexure vibration mode, and is used by being mounted on a liquid-jet head or the like. Representative examples of the liquid-jet head include an ink-jet recording head in which a part of each pressure-generating chamber communicating with a nozzle orifice that ejects ink droplets is composed of a vibration plate. This vibration plate is deformed by a piezoelectric element to apply pressure to ink in the pressure-generating chamber, and thereby ink droplets are ejected from a nozzle orifice. On the other hand, in an actuator device mounted on the ink-jet recording head, the piezoelectric elements are formed to be independent of one another, and are provided to the pressure-generating chambers, respectively. For this purpose, firstly, a uniform piezoelectric material layer is formed all over an entire surface of the vibration plate by a deposition technique, and then the piezoelectric material layer into shapes corresponding to the respective pressure-generating chambers by a lithography method. See, for example, JP-A-2003-127366 (pp. 4 to 7, and FIGS. 1 to 4).

In the configuration of JP-A-2003-127366, however, the longitudinal end portions of each piezoelectric active portion which is the substantial driver of the piezoelectric element is defined by end portions of the lower electrode. This configuration causes a problem. The piezoelectric layer is destroyed by electric field concentration that occurs in these end portions of the lower electrode.

Additionally, the piezoelectric layer as described above is formed, for example, in the following manner. A lower electrode is formed on a substrate by patterning the lower electrode, and then the piezoelectric layer is formed over the lower electrode by a sol-gel method or by a metal organic decomposition (MOD) method. When such a way of forming the piezoelectric layer in which the piezoelectric layer is formed after patterning the lower electrode there are problems. The crystal grain size of the piezoelectric layer (a dielectric material) becomes large, and degradation in crystallinity takes place as voids (air gaps) are formed. Another problem is that no piezoelectric layer with a uniform film thickness is obtained because of the steps formed in the lower electrode.

Additionally, when the piezoelectric layer is formed through crystallization by baking, the lower electrode and the substrate (an elastic film), existing as base materials of the piezoelectric layer, cause an error in the heating temperature for heating the piezoelectric layer. The error derives from the difference in the heat absorption between the substrate (the elastic film) and the lower electrode. By such an error in the heating temperature, the crystallinity of the piezoelectric layer formed in regions facing the end portions of the lower electrode is degraded, and there arises a problem. No piezoelectric layer with uniform crystallinity in a plane direction cannot be obtained. Moreover, there arises a problem, due to these problems in manufacturing the piezoelectric layer, and due to the above-mentioned electric field concentration, when the piezoelectric elements are driven. The piezoelectric layer in the regions facing the end portions of the lower electrode is destroyed.

Another actuator device is proposed, for example, in JP-A-2000-263785 (pp. 4 to 6, and FIGS. 1 and 2). In the actuator device, the end portions of the upper electrode are formed to be in inner positions than the end portions of the lower electrode. Each of piezoelectric active portions, which are the substantial drivers of the respective piezoelectric elements, has its longitudinal end portions defined by the longitudinal end portions of the upper electrode.

The configuration of JP-A-2000-263785, however, has a problem. The piezoelectric layer is destroyed by electric field concentration occurring in the end portions of the upper electrode.

Additionally, a voltage is applied between the lower electrode and the extension wiring that extends from one end portion of the upper electrode onto a substrate. Thus, the piezoelectric layer outside the end portions of the upper electrode is also driven. Consequently, there arises a problem. The end portions of the upper electrode cannot define the longitudinal end portions of each piezoelectric active portion.

The extension wiring provided from the upper electrode causes another problem. A short circuit becomes more likely to occur between the extension wiring and each of the end portions of the lower electrode.

It should be noted that these problems exist not only with a manufacturing method of an actuator device used for an ink-jet recording head, but also with a manufacturing method of an actuator device used for a liquid-jet head which ejects liquid other than ink.

SUMMARY

The advantage of some aspects of the invention is to provide an actuator device, a liquid-jet head and a liquid-jet apparatus, each with an enhanced crystallinity of the piezoelectric layer, an enhanced driving durability and an enhanced reliability.

A first aspect of the invention provides an actuator device including piezoelectric elements displaceably provided on a substrate. Each piezoelectric element is formed of a lower electrode, a piezoelectric layer and an upper electrode. While longitudinal end portions of the upper electrode define longitudinal end portions of a piezoelectric active portion, which is a substantial driver of the piezoelectric element. The lower electrode and the piezoelectric layer are provided continuously to the longitudinal outside of the piezoelectric active portion. Regions of the piezoelectric layer outside the piezoelectric active portion are formed as thin film portions having a thin thickness.

According to the first aspect, the actuator device has an enhanced driving durability and an enhanced reliability of the piezoelectric elements. The reasons for this are as follows. Electric field concentration is prevented from occurring in an end portion of an electrode while end portions of the lower electrode do not exist in a region to be the piezoelectric active portion. The crystal grain size of the piezoelectric layer is thus prevented from becoming too large, and occurrence of a void is also prevented. As a result, damage to the piezoelectric layer is prevented from occurring when the piezoelectric elements are driven.

A second aspect of the invention provides the actuator device of the first aspect with additional features as follows. While a plurality of piezoelectric elements are provided side by side in a shorter-side direction of each of the piezoelectric elements, the lower electrode is provided across the plural ones of the piezoelectric elements, and end portions of the upper electrode in the shorter-side direction define end portions of the piezoelectric active portion in the shorter-side direction.

In this case, the lower electrode is provided across the plurality of the piezoelectric elements. For this reason, even when the plurality of the piezoelectric elements are concurrently driven, a voltage drop is prevented. A uniform displacement characteristic of the piezoelectric elements is obtained in this way.

A third aspect of the invention provides the actuator device of the first or second aspect with a protective film additionally provided. The protective film is formed of an insulator covering, at least, the surfaces of the piezoelectric layers of the piezoelectric elements.

In this case, the protective film reliably prevents damage to the piezoelectric elements attributable to moisture such as humidity contained in an atmospheric ambience.

A fourth aspect of the invention provides the actuator device of any one of the first to third aspects with an extension wiring is additionally provided on one longitudinal end portion of the corresponding upper electrode. A voltage is applied through the extension wiring to each of the piezoelectric elements.

In this case, a voltage is selectively applied to each of the piezoelectric elements by the extension wiring.

A fifth aspect of the invention provides the actuator device of the fourth aspect with the following additional features. The extension wiring is composed of an adhesive layer provided on the upper electrode side and a metal layer provided on the adhesive layer side.

In this case, while the metal layer and the piezoelectric elements are reliably adhered to each other by the adhesive layer, a voltage is reliably applied to the piezoelectric elements by means of the metal layer.

A sixth aspect of the invention provides the actuator device of the fifth aspect with the following additional features. The adhesive layer extends from one end portion of the upper electrode, passes over the thin film portion, until the adhesive layer reaches the substrate. Meanwhile the metal layer is provided, on the adhesive layer, in a region located outside of a region facing the upper electrode.

In this case, the piezoelectric active portion has an excellent displacement characteristic as the extension wiring does not inhibit the displacement of the piezoelectric active portion.

A seventh aspect of the invention provides the actuator device of any one of the fourth to sixth aspects with the following additional feature. A first side surface on the extension-wiring side of the lower electrode is covered with the piezoelectric layer.

In this case, a short-circuit between the lower electrode and the extension wiring can be reliably prevented from occurring as the piezoelectric layer is interposed between the lower electrode and the extension wiring.

An eighth aspect of the invention provides the actuator device of any one of the first to seventh aspects with the following additional feature. Each thin film portion has a thickness of not less than 0.1 µm.

In this case, the lower electrode is covered with the thin film portions with the thickness of each thin film portion being not less than a predetermined thickness. As a result, a short-circuit is reliably prevented between the lower electrode and another electrode (the extension wiring, in particular).

A ninth aspect of the invention provides the actuator device of any one of the first to eighth aspects with the following additional feature. Each thin film portion has a thickness of not more than 95% of the thickness of a region of the piezoelectric layer provided to the piezoelectric active portion.

In this case, electric field concentration in end portions of the upper electrode is prevented by making the thickness of the thin film portions not more than a predetermined thickness. As a result, damage to the piezoelectric layer is reliably prevented.

A tenth aspect of the invention provides a liquid-jet head. The liquid-jet head includes a passage-forming substrate on which pressure-generating chambers communicating with nozzle orifices for ejecting liquid are provided. The liquid-jet head also includes the actuator device of any one of the first to ninth aspects as liquid jetting unit for jetting liquid from the nozzle orifices by generating a change in pressure in each of the pressure-generating chambers. The liquid jetting unit is provided in a position on one surface side.

According to the tenth aspect, the liquid-jet head that is enhanced in liquid jetting characteristic and in driving stability and reliability is obtained.

An eleventh aspect of the invention provides the liquid-jet head of the tenth aspect with the following additional features. While the lower electrode is provided continuously to the outside of the pressure-generating chambers in the longitudinal direction of each of the pressure-generating chambers, the upper electrode is provided in a region facing the corresponding pressure-generating chamber in the longitudinal direction of each of the pressure-generating chambers.

In this case, the liquid-jet head that is enhanced in liquid jetting characteristic, in driving stability and in reliability is obtained.

A twelfth aspect of the invention provides a liquid-jet apparatus which includes the actuator device of the tenth or eleventh aspect.

In this case, the liquid-jet apparatus that is enhanced in liquid jetting characteristic, in driving stability and in reliability is obtained.

BRIEF DESCRIPTION OF THE DRAWINGS

The invention will be described with reference to the accompanying drawings, wherein like members reference like elements.

DESCRIPTION OF THE EXEMPLARY EMBODIMENTS

The present invention will be described in detail below with reference to embodiments.

Embodiment 1

Figure 1:
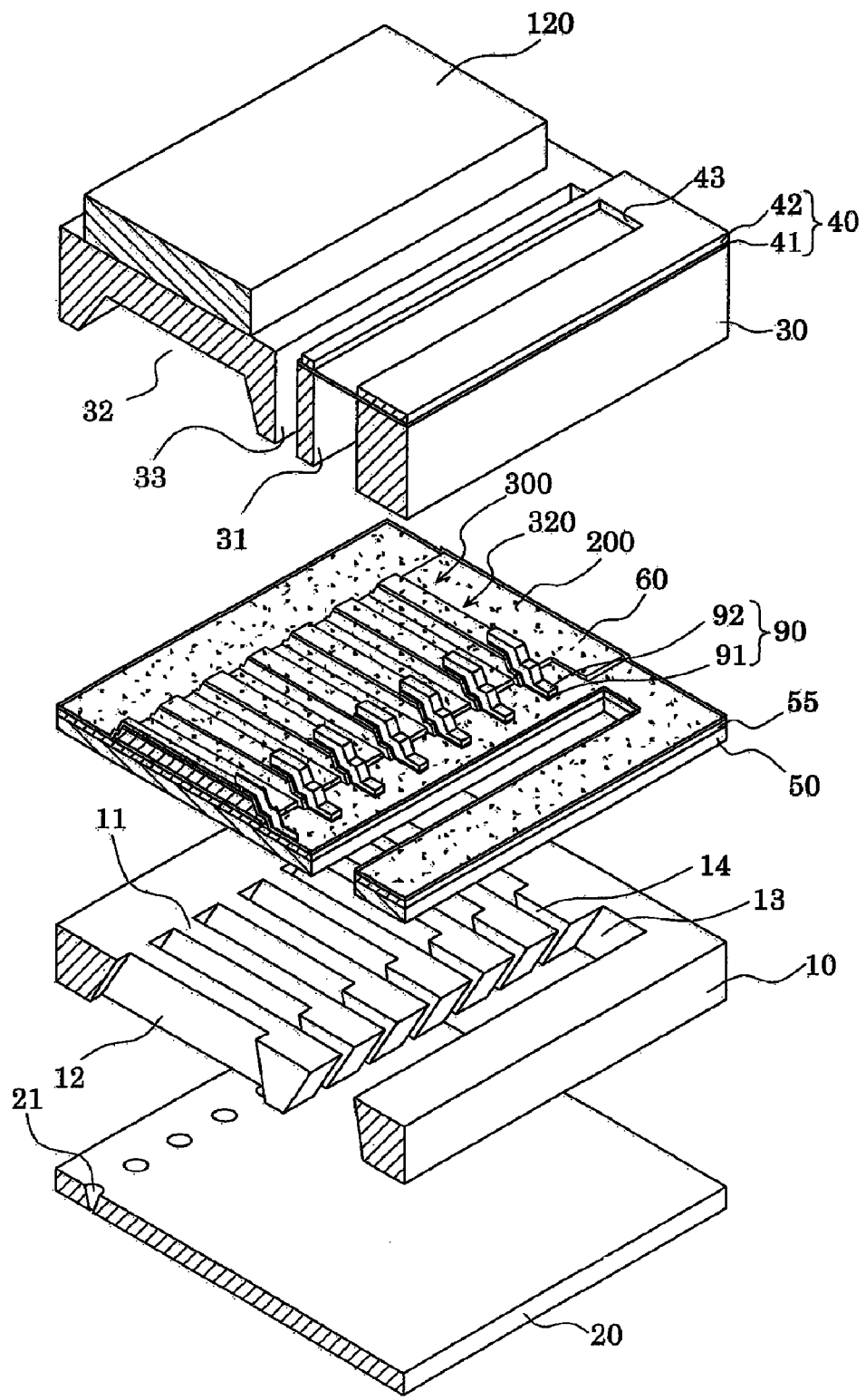
FIG. 1 is an exploded perspective view showing a schematic configuration of a recoding head according to Embodiment 1.
Figure 2A:
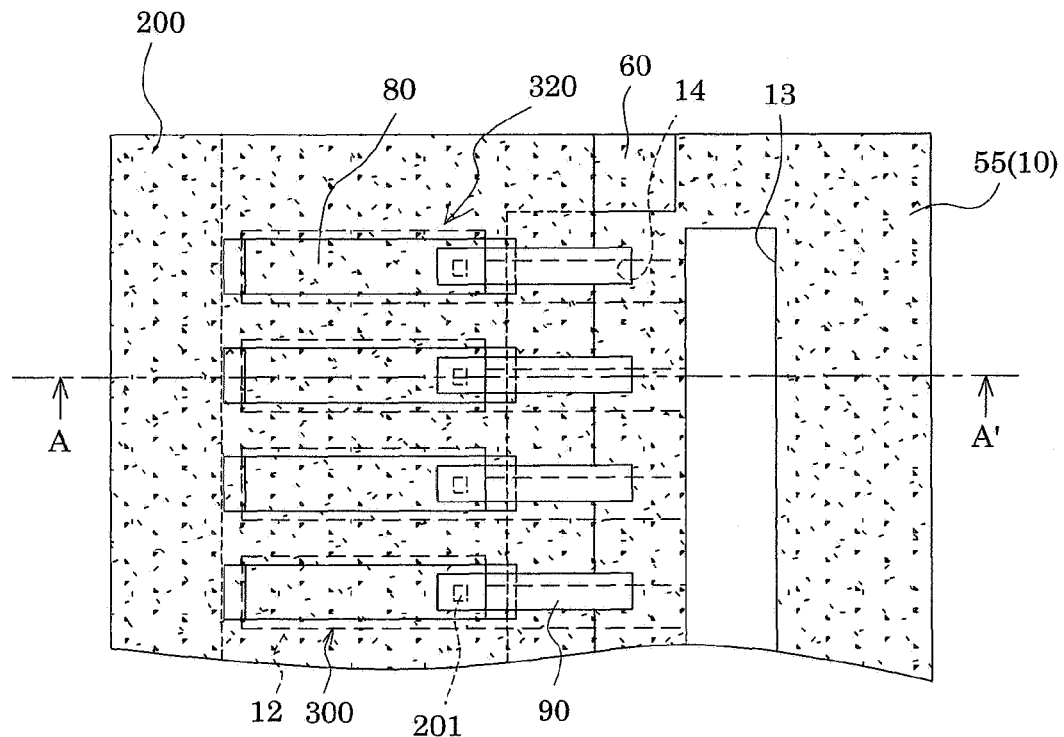
FIG. 2A is a plan view of the recoding head according to Embodiment 1.
Figure 2B:
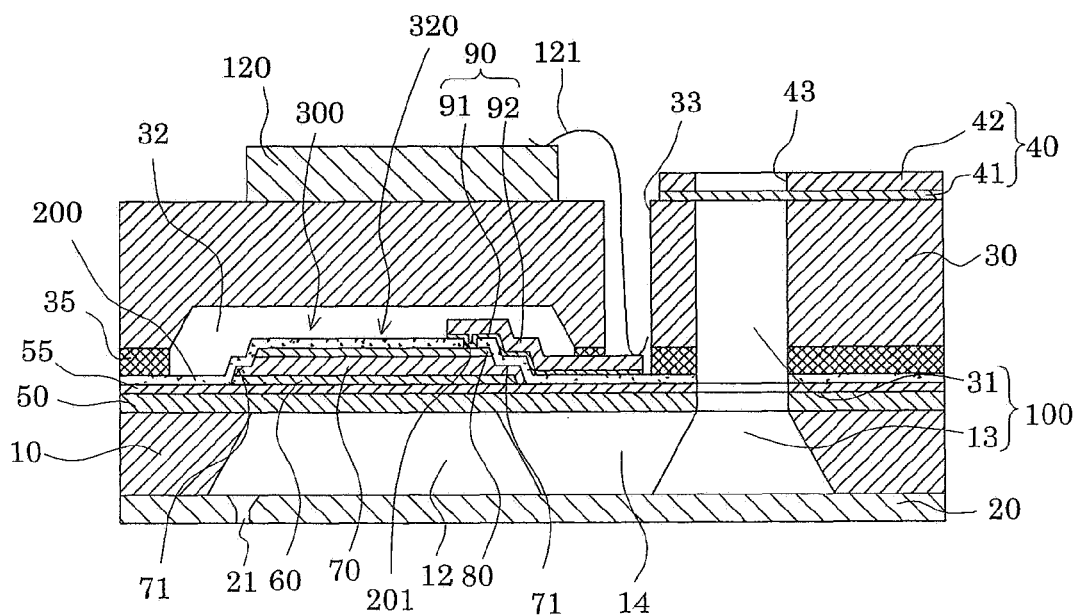
FIG. 2B is a cross-sectional view of the recoding head according to Embodiment 1.

FIG. 1 is an exploded perspective view of an ink-jet recoding head, which is an example of a liquid-jet head according to Embodiment 1. FIGS. 2A and 2B are a plan view of a chief part, and a cross-sectional view taken along an A-A' line in FIG. 2A, respectively, of the ink-jet recoding head according to Embodiment 1.

As shown in the drawings, a passage-forming substrate 10 is formed of a single-crystal silicon substrate in this embodiment. On one surface of the passage-forming substrate 10, an elastic film 50 made of silicon dioxide is previously formed by thermal oxidation in a thickness of 0.5 µm to 2 µm. On the passage-forming substrate 10, a plurality of pressure-generating chambers 12 partitioned by a plurality of compartment walls 11 are provided side by side in the width direction of each of the pressure-generating chambers 12. Additionally, in the passage-forming substrate 10, a communicating portion 13 is formed in a region outside the pressure-generating chambers 12 in the longitudinal direction of each of the pressure-generating chambers 12. The communication portion 13 and the corresponding pressure-generating chamber 12 are allowed to communicate with each other through an ink supply path 14 provided for each pressure-generating chamber 12. Note that, by communicating with a reservoir portion 31 of a protective plate 30, which will be described later, the communication portion 13 composes a part of a reservoir 100 to be a common ink chamber for the pressure-generating chambers 12. The ink supply path 14 is formed to be narrower than each pressure-generating chamber 12, and maintains, at a constant level, the path resistance of the ink flowing into the pressure-generating chamber 12 from the communicating portion 13.

Additionally, a nozzle plate 20 having nozzle orifices 21 drilled therein is fixed to an opening surface side of the passage-forming substrate 10 by use of an adhesive agent, a thermal adhesive film or the like. The nozzle orifices 21 communicate respectively with vicinities of the opposite ends of the pressure-generating chambers 12 to the corresponding ink supply paths 14. The nozzle plate 20 is made of glass ceramic, a single-crystal silicon substrate, stainless steel or the like having a thickness of, for example, a 0.01 mm to 1.00 mm, and having a coefficient of linear expansion of, for example, $2.5 \times 10^{-6}/°C$. to $4.5(10-6/°C$. at a temperature not higher than 300° C.

On the other hand, on the opposite side to the opening surface side of the passage-forming substrate 10, the elastic film 50 made of silicon dioxide is formed, as described above, in a thickness of about 1.0 µm, for example. On this elastic film 50, a layer of an insulation film 55 made of zirconium oxide (ZrO2) is formed in a thickness of, for example, about 0.3 µm to 0.4 µm. Additionally, on this insulation film 55, piezoelectric elements 300 are formed. Each piezoelectric element 300 is composed of a lower electrode film 60 having a thickness of, for example, about 0.1 µm to 0.2 µm, a piezoelectric layers 70 having a thickness of, for example, about 0.5 µm to 5 µm, and an upper electrode film 80 having a thickness of, for example, about 0.05 µm is formed.

Here, the piezoelectric element 300 denotes a part including the lower electrode film 60, the piezoelectric layer 70 and the upper electrode film 80. In general, the piezoelectric element 300 is formed by using any one of two electrodes of the piezoelectric element 300 as a common electrode, and by patterning the other one of these electrodes and the piezoelectric layer 70 for each pressure-generating chamber 12. Additionally, apart termed here as a piezoelectric active portion 320 is formed of any patterned one of these electrodes and the piezoelectric layer 70. In the piezoelectric active portion 320, piezoelectric strain occurs when a voltage is applied to both electrodes. In this embodiment, the lower electrode film 60 is used as a common electrode to the piezoelectric elements 300, and the upper electrode film 80 is used as individual electrodes of the respective piezoelectric elements 300. However, there is no problem if the lower electrode film 60 and the upper electrode film 80 are used the other way round. In any one of these cases, the piezoelectric active portion 320 is formed for each pressure-generating chamber 12.

Additionally, in this embodiment, end portions (the length) of the piezoelectric active portion 320 in a longitudinal direction thereof are defined by end portions, in the longitudinal direction, of the upper electrode film 80. This will be described later in detail. The lower electrode film 60 and the piezoelectric layer 70 are configured to be continuously provided so as to extend to the outside, in the longitudinal direction, of the piezoelectric active portion 320. Additionally, regions of the piezoelectric layer 70 outside of the piezoelectric active portion 320 are configured to be thin film portions 71, the thickness of which is thinner than the thickness of the piezoelectric layer 70 in a region to be the piezoelectric active portion 320. Furthermore, the thickness of the thin film portion 71 in a region facing the lower electrode film 60 is made substantially uniform. The thickness of the piezoelectric layer 70 is suddenly changed in a boundary region between the piezoelectric active portion 320 and each thin film portion 71. The thickness of the piezoelectric layer 70 in each thin film portion 71 is thus made thin.

Additionally, a device termed here as an actuator device is configured of the piezoelectric elements 300 provided on a predetermined substrate (on the passage-forming substrate 10) and driven. Note that, while the elastic film 50, the insulation film 55 and the lower electrode film 60 act as a vibration plate in the above-mentioned example, the configuration of the vibration plate is, apparently, not limited to this. In another allowable configuration, while the elastic film 50 and the insulation film 55 are not provided, only the lower electrode film 60 is configured to act as the vibration plate.

Additionally, as a material for the piezoelectric layer 70 constituting the piezoelectric elements 300, it is possible to use, for example, a ferroelectric-piezoelectric material, such as lead-zirconate-titanate (PZT); or a relaxor ferroelectric, which is obtained by adding a metal, such as niobium, nickel, magnesium, bismuth or yttrium, to the ferroelectric-piezoelectric material.

Additionally, at least surfaces of the piezoelectric layer 70 of the piezoelectric elements 300 are covered with a protective film 200 made of a moisture-resistant insulating material. In this embodiment, the protective film 200 is configured to be provided continuously over an entirety of a surface of the passage-forming substrate 10, the surface having the piezoelectric elements 300 provided thereon.

By covering the piezoelectric elements 300 with the protective film 200 in the above described manner, it is possible to prevent the damage to the piezoelectric elements 300 due to moisture and the like in the air. Here, for the protective film 200, any moisture-resistant material may be used. For example, it is preferable to use an inorganic insulating material, such as a silicon oxide ($SiO_x$), a tantalum oxide ($TaO_x$) or an aluminum oxide ($AlO_x$). It is especially preferable to use an aluminum oxide ($AlO_x$), which is an inorganic amorphous material, for example, alumina ($Al_2O_3$). When an aluminum oxide is used as a material for the protective film 200, it is possible to sufficiently prevent moisture transmission under a high humidity environment even in a case where the film thickness of the protective film 200 is made relatively small, for example, about 100 nm. In the embodiment, alumina ($Al_2O_3$) is used for the protective film 200.

Note that it is only necessary for the protective film 200 to cover at least the surface of the piezoelectric layer 70. The protective film 200 may be configured to cover the surface of the piezoelectric layer 70, and side surfaces and the peripheral edge portion of the upper surface of the upper electrode film 80, and may be provided to be continuous across a plurality of piezoelectric elements 300. In other words, in an allowable configuration, the protective film 200 is not provided on the main portion (substantially the central region) of the upper surface of the upper electrode film 80, and an opening portion is provided as an opening in the main portion of the upper surface of the upper electrode film 80. The provision of the opening portion in the protective film 200 allows an uninhibited displacement of the piezoelectric elements 300 (the piezoelectric active portions 320), which displacement is not prevented by the protective film 200. As a result, a favorable ink ejection characteristic is maintained.

Additionally, a lead electrode 90 is provided on one end portion, in the longitudinal direction, of the piezoelectric elements 300 on the protective film 200. The lead electrode 90 is extension wiring extending from each of the piezoelectric elements 300. One end portion of each lead electrode 90 is connected to the corresponding upper electrode film 80 via a corresponding one of communicating holes 202 provided in the protective film 200. In addition, the other end portion of each lead electrode 90 extends to the side of the ink supply paths 14 in the passage-forming substrate 10. The extended other end portions of the lead electrodes 90 are connected to a drive circuit 120, to be described later, for driving the piezoelectric elements 300 respectively via connecting wirings 121. The lead electrode 90 as described above is formed to be layered by an adhesive layer 91 and a metal layer 92.

Here, as to the main material of the metal layer 92, there is no particular limitation except that the material should have a relatively high conductivity. Examples of such materials include gold (Au), platinum (Pt), aluminum (Al) and copper (Cu) while Gold (Au) is used in this embodiment. Additionally, any material capable of securing adhesion of the metal layer 92 is used for the adhesive layer 91. Examples of such materials include titanium (Ti), a titanium-tungsten compound (TiW), nickel (Ni), chrome (Cr), a nickel-chrome compound (NiCr) while nickel-chrome (NiCr) is used in this embodiment.

Additionally, the configuration of each of the piezoelectric elements 300 will be described in detail here. In this embodiment, the lower electrode film 60 and the piezoelectric layer 70 are provided continuously to the outside, in the longitudinal direction, of the pressure-generating chamber 12. The lower electrode film 60 is provided continuously across a plurality of piezoelectric elements 300, and serves as a common electrode of the plurality of piezoelectric elements 300.

Additionally, end portions of the upper electrode film 80 in the longitudinal direction of each pressure-generating chamber 120 are provided in inner-side positions than end portions of the lower electrode film 60 and the piezoelectric layer 70, in a region facing the corresponding pressure-generating chamber 120. These end portions, in the longitudinal direction, of the upper electrode film 80 define the corresponding end portions (the length), in the longitudinal direction, of each piezoelectric active portion 320, which is a substantial drive portion of the corresponding piezoelectric element 300. Additionally, end portions of the upper electrode film 80 in a shorter-side direction of each pressure-generating chamber 120 are provided in regions facing the corresponding pressure-generating chamber 120. These end portions, in the shorter-side direction, of the upper electrode film 80 define end portions (the width), in the shorter-side direction, of each of the piezoelectric active portions 320.

In other words, each piezoelectric active portion 320 has the end portions thereof in the longitudinal direction and in the shorter-side direction defined by the upper electrode films 80, which is obtained by the patterning. The piezoelectric active portion 320 is provided only in a region facing the corresponding pressure-generating chamber 12.

Additionally, as has been described above, the piezoelectric layer 70 is provided so as to be continued to the outside, in the longitudinal direction, of each pressure-generating chamber 12. In the piezoelectric layer 70, an end portion on one side facing the lead electrodes 90 is provided at an outer position than an end portion of the lower electrode film 60. In the piezoelectric layer 70, an end surface of the lower electrode film 60 on one side facing the lead electrodes 90 is covered with the piezoelectric layer 70. The piezoelectric layer 70 is thereby interposed between the lower electrode film 60 and the lead electrodes 90, and occurrence of a short-circuit between the lower electrode film 60 and the lead electrodes 90 is reliably prevented by the interposition. The reason for this is as follow. Suppose, for example, that the end surface of the lower electrode film 60 is exposed when the end portion of the lower electrode film 60 is provided in an outer-side position than the end portion of the piezoelectric layer 70. In such a case, coverage by the protective film 200 over the end surface of the lower electrode film 60 is not satisfactory when the protective film 200 is formed by a sputtering method, an evaporation method or the like. Consequently, the lower electrode film 60 and the lead electrodes 90 are at the risk of being short-circuited with each other. It should be noted that the piezoelectric layer 70 is not provided in a region between each adjacent ones of the piezoelectric active portions 320, and is provided independently for each piezoelectric element 300.

Moreover, in the piezoelectric layer 70, the thin film portions 71 (thinner than the piezoelectric layer 70 in regions to be the piezoelectric active portions 320) are provided in outer-side regions in the longitudinal direction of the piezoelectric active portions 320, that is, provided in outer-side regions, in the longitudinal direction, of the upper electrode films 80. The thickness of the piezoelectric layer 70 in regions of the thin film portions 71, the regions facing the lower electrode film 60, is made substantially uniform. That is, in a region to be a boundary between each piezoelectric active portion 320 and each thin film portion 71, the thickness of the piezoelectric layer 70 in the thin film portions 71 is suddenly changed to be thinner.

Note that, in this embodiment, as shown in FIG. 2B, each of the piezoelectric layer 70 and of the upper electrode film 80 are patterned to have the respective widths getting narrower toward the upper electrode 80, and to have sloping side surfaces.

As described above, the lower electrode film 60 is formed to be longer than each piezoelectric element 300, and the end portions, in the longitudinal direction, of the piezoelectric active portions 320 are configured to be defined by the end portions of the upper electrode films 80. In the piezoelectric layer 70, the thin film portion 71, in addition, is provided in an outer-side position in the longitudinal direction of the piezoelectric active portions 320. Accordingly, when the piezoelectric elements 300 are driven, electric field concentration occurring in the end portions of the lower electrode film 60 and of the upper electrode films 80 is prevented. This results in a prevention of damage to the piezoelectric layer 70. Additionally, the lower electrode film 60 is provided continuously to the outside of the piezoelectric layer 60. Accordingly, when the piezoelectric layer 70 is formed by a manufacturing method described later in detail, the piezoelectric layer 70 is obtained as being excellent in crystallinity for the following reasons. No difference in level is generated in the end portions of the lower electrode film 60, and in the regions becoming the piezoelectric active portions 320. Problems, such as that the crystal grain size becomes large in a part of the piezoelectric layer 70 in the regions to be the piezoelectric active portions 320, and that voids (air gaps) occur, are prevented. Additionally, the piezoelectric layer 70 in the regions to be piezoelectric active portions 320 is formed in a uniform thickness because no difference in level that may possibly be formed by the end portions of the lower electrode film 60 exists in the regions to be the piezoelectric active portions 320. Furthermore, when the piezoelectric layer 70 is formed by a so-called sol-gel method or an MOD method, in which the piezoelectric layer 70 is formed by crystallization through heating and baking, the piezoelectric layer 70 excellent in crystallinity is obtained. One of the reasons for this is that no boundary portion between the substrate (the passage-forming substrate 10) and the lower electrode film 60 exists, as base materials of the piezoelectric layer 70, in the regions to be the piezoelectric active portions 320. Consequently, in the regions to be the piezoelectric active portions 320, there is no error in a heating temperature taking place as a result of a difference between the base materials at the heating, that is, as a result of the difference in heat absorption between the substrate and the lower electrode film 60.

Thus, the damage to the piezoelectric layer, which may possibly be caused by electric field concentration to the end portions of the lower electrode film 60, or by the crystallinity of the piezoelectric layer 70 is prevented. Consequently, the piezoelectric elements 300 are enhanced in driving durability, and are made excellent in reliability.

Note that, in order to reliably insulate each of the lead electrodes 90 and the lower electrode film 60 from each other, it is preferable to form the thin film potion 71 in a thickness of not less than 0.1 μm.

Additionally, in order to prevent electric field concentration to the end portions of the upper electrode films 80, the thin film potion 71 preferably has a thickness not more than 96% of the thickness of the piezoelectric layer 70 in the regions to be the piezoelectric active portions 320. In this embodiment, since the thickness of the piezoelectric layer 70 in the regions to be the piezoelectric active portions 320 is 1.1 μm, the thickness of the thin film portion 71 is not more than 1.06 μm.

In other words, the thin film portions 71 preferably has a thickness of 0.10 μm to 1.06 μm—about 9.1% to 96% of the thickness (1.1 μm) of the piezoelectric layer 70 in the regions to be the piezoelectric active portions 320.

Examples 1 to 4

The piezoelectric elements having the above-described configurations were formed on the passage-forming substrate. The thicknesses of the thin film portions of the piezoelectric layers were set at 96.5%, 90.9%, 81.8% and 63.6% of the thickness (1.1 μm) of the piezoelectric layer in the regions to be the piezoelectric active portion. The piezoelectric elements thus prepared were referred to as Examples 1 to 4, respectively.

Comparative Example 1

For the purpose of comparison, a piezoelectric element which was the same as Examples 1 to 4 except that the thin film portions were not provided in the piezoelectric layer on the passage-forming substrate was formed. In other words, the thickness of each thin film portion of the piezoelectric element was set at the same as, i.e., 100% of, the thickness (1.1 μm) of the piezoelectric layer in the regions to be the piezoelectric active portions. Such a piezoelectric element as prepared in this way was referred to as Comparative Example 1.

Test Example 1

The same drive voltage (25 V) was applied to the piezoelectric elements of Examples 1 to 4 and Comparative Example 1, and then, electric field strengths of the respective examples, and proportions of the electric field strengths relative to that of Comparative Example 1, were calculated. Results of these calculations are shown below in Table 1.

TABLE 1

|  | Thickness of Thin Film Portion | Electric Field Strength ($10^6$ V/m) | Proportion of Electric Field Strength |
| --- | --- | --- | --- |
| Comparative Example 1 | 100% | 169 | 100% |
| Example 1 | 96.5% | 109 | 64% |
| Example 2 | 90.0% | 87 | 51% |
| Example 3 | 81.8% | 94 | 56% |
| Example 4 | 63.6% | 91 | 54% |

Figure 3:
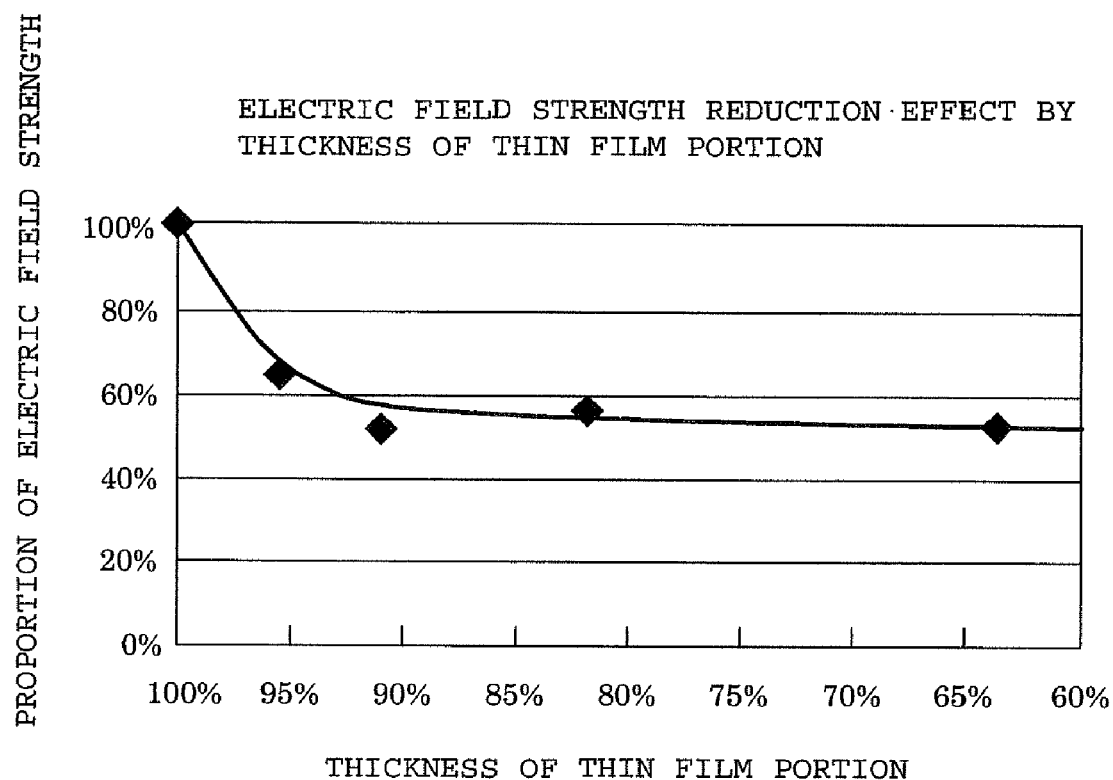
FIG. 3 is a graph showing a test result of Test Example 1.

From the thicknesses of the thin film portions and the proportions of electric field strength shown in Table 1, an approximate curve was found by the least-square method. The result of this is shown in FIG. 3. The result shown in FIG. 3 indicates that, when the thickness of the thin film portion was 96% or less of the thickness of the piezoelectric layer in the region to be the piezoelectric active portion, the electric field strength was reduced. Additionally, the result indicates that, when the thickness of the thin film portion was set at not more than 90% thereof, the electric field strength is reduced more effectively. In addition, even if the thickness of the thin film portion was made as thin as not more than 90% thereof, reduction of the electric field strength was saturated.

What has been said thus far indicates that the thickness of not more than 96% of the piezoelectric layer 70 is preferable, and a thickness of not more then 90% is more preferable, as the thickness of the thin film portion 71.

Additionally, the test results as described above, indicate the following fact. As has been described above, the lower electrode film 60 was formed to be longer than each of the piezoelectric active portions 320, the longitudinal end portions of the piezoelectric active portions 320 were defined by the longitudinal end portions of the upper electrode films 80. The thin portion 71 was provided to the piezoelectric layer 70 outside the piezoelectric active portions 320. As a result, electric field concentration to the longitudinal end portions of the lower electrode film 60 and the upper electrode films 80 was prevented at the time of driving the piezoelectric elements 300. In addition, damage to the piezoelectric layer 70 was also prevented.

Furthermore, as shown in FIG. 2B, the protective plate 30 including a piezoelectric element holding portion 32 in a region facing the piezoelectric elements 300 is joined onto the passage-forming substrate 10 by an adhesive agent 35. The piezoelectric element holding portion 32 has a space which is large only to the extent not disturbing movements of the piezoelectric elements 300. Note that the piezoelectric element holding portion 32 is only required to have a space which is large only to the extent not disturbing movements of the piezoelectric elements 300, and that the space may be hermetically sealed, or may not be hermetically sealed.

Additionally, the reservoir portion 31 is provided to the protective plate 30 in a region facing the communicating portion 13. As has been described above, this reservoir portion composes the reservoir 100 to be a common ink chamber to the pressure-generating chambers 12 by being allowed to communicate with the communicating portion 13 of the passage-forming substrate 10. Additionally, a through hole 33 penetrating the protective plate 30 in the thickness direction thereof is provided in a region of the protective plate 30 between the piezoelectric element holding portion 32 and the reservoir portion 31. A part of the lower electrode film 60, and extremities of the lead electrodes 90, are exposed inside of the through hole 33.

Additionally, a driver circuit 120 used for driving the piezoelectric elements 300 is mounted on the protective plate 30. As the driver circuit 120, for example, a circuit board, a semiconductor integrated circuit (an IC) or the like can be used. Moreover, the driver circuit 120 and the lead electrodes 90 are electrically connected to each other through the connection wiring 121, which is formed of a conductive wire such as a bonding wire.

For the protective plate 30, it is preferable to use a material having a thermal expansion coefficient substantially equal to that of the material of the passage-forming substrate 10. Examples of such a material include glass and a ceramic material. In this embodiment, the protective plate 30 is made of a single-crystal silicon substrate, which is the same material that the passage-forming substrate 10 is made of.

A compliance plate 40, which is composed of a sealing film 41 and a fixing plate 42, is joined onto the protective plate 30. Here, the sealing film 41 is made of a material with a low rigidity and with flexibility, for example, a polyphenylene sulfide (PPS) film having a thickness of 6 μm. This sealing film 41 seals one direction of the reservoir portion 31. Additionally, the fixing plate 42 is made of a hard material such as a metal, for example, a 30-μm thick stainless steel (SUS) or the like. In this fixing plate 42A, a region facing the reservoir 100 is formed into an opening portion 43 by completely removing the fixing plate 42 in the thickness direction thereof. Accordingly, only the flexible sealing film 41 seals one direction of the reservoir 100.

An ink-jet recording head of this embodiment as described above takes in ink from unillustrated external ink supplying means, and fills, with ink, an interior of components thereof from the reservoirs 100 to the nozzle orifices 21. Then, the ink-jet recording head applies a voltage between the lower electrode film 60 and each of the upper electrode films 80, which correspond to each of the pressure-generating chambers 12, in accordance with a recording signal from the driver circuit 120. As a result, the elastic film 50, the lower electrode film 60 and the piezoelectric layers 70 are flexurally deformed to increase the pressure in each of the pressure-generating chambers 12. The ink droplets are thus ejected from the nozzle orifices 21.

Here, a manufacturing method of an ink-jet recording head will be described with reference to FIGS. 4A to 7B. FIGS. 4A to 7B are cross-sectional views of one of the pressure-generating chambers in a longitudinal direction thereof. These cross-sectional views show the manufacturing method of the ink-jet recoding head, which is an example of a liquid-jet head.

Figure 4A:
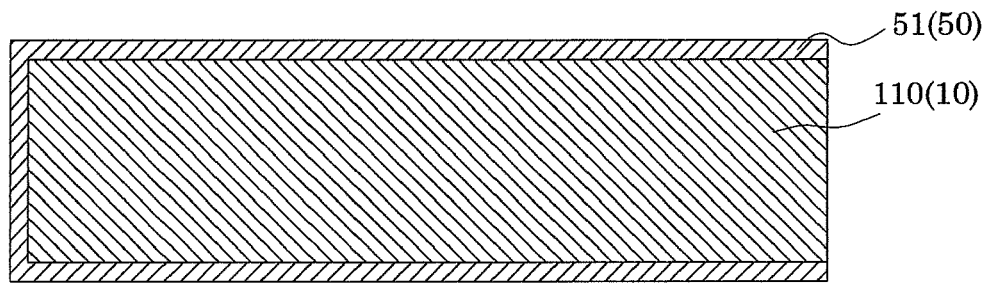
FIGS. 4A to 4C are a cross-sectional view showing a manufacturing process of the recoding head according to Embodiment 1.

First of all, as shown in FIG. 4A, a wafer 110 for a passage-forming substrate, which is a silicon wafer, is thermally oxidized in a diffusion furnace at about 1100° C. to form, on the surface thereof, a silicon dioxide film 51 to constitute the elastic film 50. Note that, in this embodiment, a highly rigid silicon wafer with a relatively large thickness of about 625 μm is used as the wafer 110 for a passage-forming substrate.

Figure 4B:
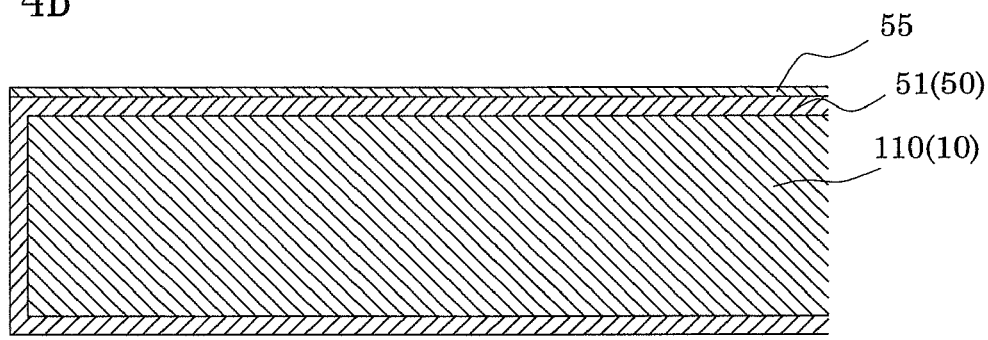

Next, as shown in FIG. 4B, the insulation film 55 made of zirconium oxide ($ZrO_2$) is formed on the elastic film 50 (the silicon dioxide film 51). Specifically, after a zirconium (Zr) layer is formed on the elastic film 50 (the silicon dioxide film 51), for example, by a sputtering method or the like, the zirconium layer is thermally oxidized, for example, in a diffusion furnace at 500° C. to 1200° C. to form the insulation film 55 made of zirconium oxide.

Figure 4C:
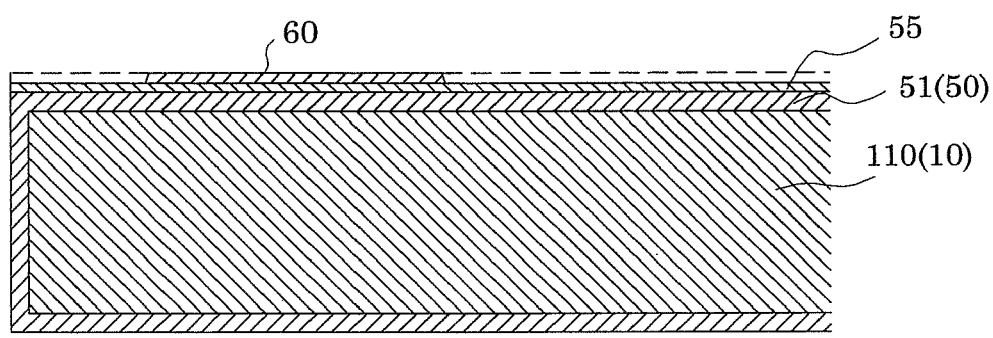

Next, as shown in FIG. 4C, after the lower electrode film 60 is formed, for example, by forming layers of platinum (Pt) and iridium (Ir) on the insulation film 55, the lower electrode film 60 is patterned into a predetermined shape. The lower electrode film 60 is not limited to one obtained by forming layers of platinum (Pt) and iridium (Ir). An alloy of these two metals may be used as the lower electrode film 60. Alternatively, a single layer made of either of platinum (Pt) or iridium (Ir) may be used. Furthermore, metals, metal oxides or the like other than the above-mentioned materials may be used.

The lower electrode film 60 is formed in regions where the piezoelectric active portions 320 are formed, and is formed continuously to the outside of the piezoelectric active portions 320.

Figure 5A:
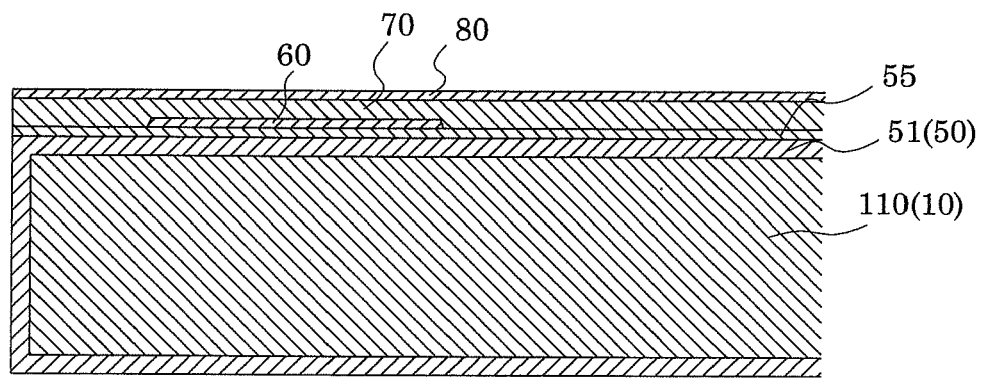
FIGS. 5A to 5C are a cross-sectional view showing a manufacturing process of the recoding head according to Embodiment 1.

Then, as shown in FIG. 5A, the piezoelectric layer 70 made of, for example, lead-zirconate-titanate (PZT) or the like, and the upper electrode film 80 made of, for example, iridium, are formed on an entire surface of the wafer 110 for a passage-forming substrate.

Examples of a material used for the piezoelectric layer 70 composing the piezoelectric elements 300 include a ferro-electric-piezoelectric material such as lead-zirconate-titanate (PZT), and a relaxor ferroelectric material formed by adding metal such as niobium, nickel, magnesium, bismuth or yttrium to the ferroelectric-piezoelectric material. The composition thereof may be selected as appropriate in consideration of characteristics of the piezoelectric elements 300, the intended use thereof and the like. The method of forming the piezoelectric layer 70 is not particularly limited. In the embodiment described above, the piezoelectric layer 70 is formed by use of what is called a sol-gel method. The piezoelectric layer 70 made of a metallic oxide is obtained by the sol-gel method in the following way. Firstly, a metal organic compound is dissolved and dispersed into a catalyst to obtain what is called sol; secondly, the sol is made into gel through application and drying of the sol; and, thirdly, the gel is baked at a high temperature. Note that the method of forming the piezoelectric layer 70 is not limited to the sol-gel method, and that the piezoelectric layer 70 may be formed by utilizing a thin film formation method, for example, an MOD method, sputtering method, or the like.

In the formation of the piezoelectric layer 70 such as one described above, the end portions of the lower electrode films 60 in a longitudinal direction of each of the pressure-generating chambers 12 are provided to the outside of regions to be the piezoelectric active portions 320. Accordingly, in the regions to be the piezoelectric active portions 320, no difference in level is generated in the end portions of lower electrode film 60. As a result, such troubles as follow are prevented. For example, the crystal grain size does not become large in a part of the piezoelectric layer 70, which part is to be the piezoelectric active portions 320, and a void (an air gap) is produced in the part. Consequently, the piezoelectric layer 70 excellent in crystallinity is obtained. Additionally, the piezoelectric layer 70 in the regions to be the piezoelectric active portions 320 is formed into a uniform thickness because no difference in level that may possibly formed by the end portions of the lower electrode film 60 exists in the regions to be the piezoelectric active portions 320.

Furthermore, when the piezoelectric layer 70 is formed through crystallization by heating and baking, no boundary portion between the substrate (the wafer 110 for a passage-forming substrate) and the lower electrode film 60 exists, as base materials of the piezoelectric layer 70, in the regions to be the piezoelectric active portions 320. Accordingly, the error in the heating temperature is eliminated in the regions to be the piezoelectric active portions 320. The error may possibly be caused by the difference between the base materials at the heating, that is, by the difference in the heat absorption between the substrate and the lower electrode film 60. As a result, the piezoelectric layer 70 excellent in crystallinity is obtained.

Figure 5B:
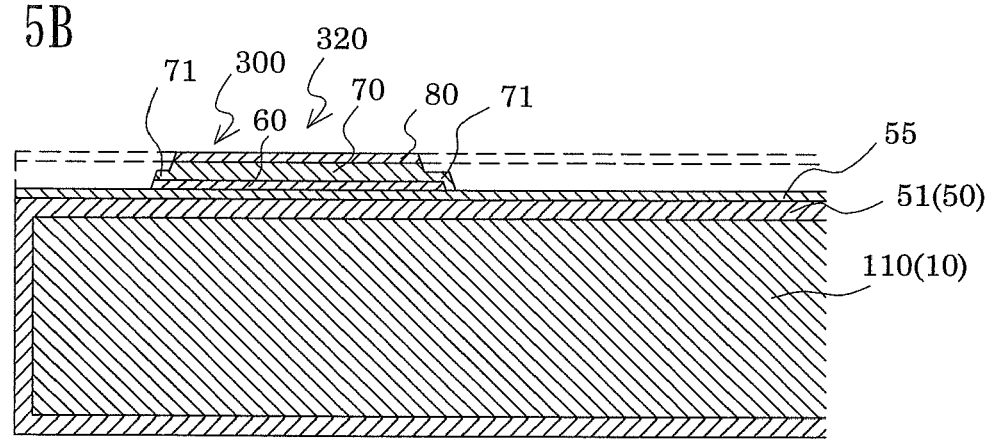

Next, as shown in FIG. 5B, the piezoelectric elements 300 are formed in regions facing the respective pressure-generating chambers 12 by patterning the piezoelectric layer 70 and the upper electrode film 80 for each of the regions corresponding to the respective pressure-generating chambers 12. Meanwhile, each of the piezoelectric active portions 320 is formed for the region facing the corresponding one of the pressure-generating chambers 12. Additionally, half-etching is performed to a part of the piezoelectric layer 70 and of the upper electrode films 80 to form the thin film portions 71, which are thinner than the piezoelectric layer 70 in the regions to be the piezoelectric active portions 320. The thin film portions are formed, in the piezoelectric layer 70, outside of the piezoelectric active portions 320, that is, outside of the upper electrode films 80.

Patterning of the piezoelectric elements 300 and a formation method of the thin film portions 71 as have been described are not particularly limited. An example of the way to form the piezoelectric elements 300 and the thin film portion 71 include the following. The thin film portion 71 in the piezoelectric layer 70 is formed by the half-etching of the piezoelectric layer 70 and the upper electrode film 80, which are formed over the entire surface of the wafer 110 for a passage-forming substrate. Thereafter, patterning, at one time, the piezoelectric layer 70 and the upper electrode film 80 in unnecessary regions until the patterning reaches the lower electrode film 60 or the insulation film 55. Another example of the forming the piezoelectric elements 300 and the thin film portions 71 is as follows. A resist is formed on the upper electrode film 80 by a photolithography method, and thereafter the piezoelectric layer 70 and the upper electrode film 80 are dry-etched with the resist having the same shape as the piezoelectric elements 300, which include the thin film portions 71, are supposed to have. Obviously, the piezoelectric elements 300 and the thin film portions 71 may be formed as follows. The piezoelectric layer 70 and the upper electrode film 80 are subjected to patterning at one time until the patterning reaches the lower electrode film 60 or the insulation film 55. Thereafter, the thin film portions 71 are formed by the half-etching of a part of the piezoelectric layer 70 and the upper electrode film 80.

Additionally, for example, by previously setting side surfaces of the resist in a sloping state, the piezoelectric layer 70 and the upper electrode film 80 are patterned so as to make the width of the upper electrode films narrower than the width of the piezoelectric layer 70 in patterning the piezoelectric layer 70 and the upper electrode film 80. As a result, side surfaces of the piezoelectric layer 70 and the upper electrode film 80 become sloping surfaces.

Figure 5C:
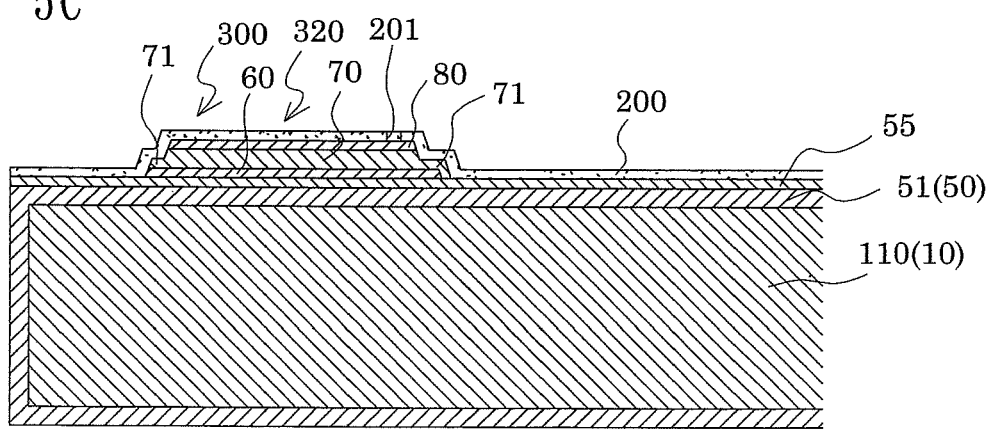

Next, as shown in FIG. 5C, a communicating hole 201 is formed by forming the protective film 200 on the entire surface of the wafer 110 for a passage-forming substrate, and thereafter patterning the protective film 200 into a predetermined shape.

Figure 6A:
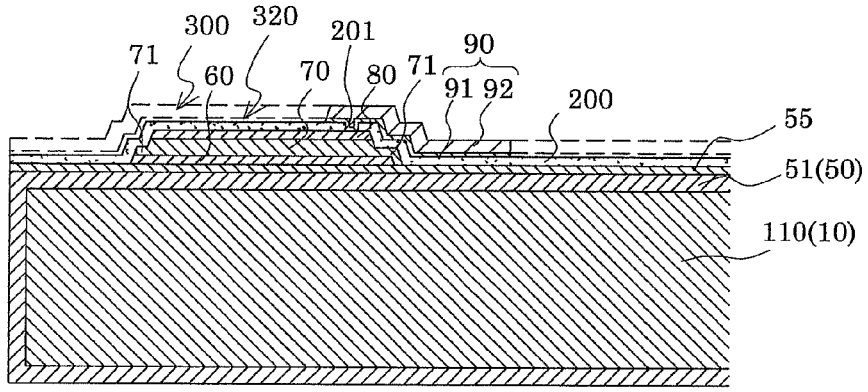
FIGS. 6A to 6C are a cross-sectional view showing a manufacturing process of the recoding head according to Embodiment 1.

Next, as shown in FIG. 6A, the lead electrodes 90 are formed. Specifically, the lead electrodes 90 are formed by, firstly, forming the metal layer 92 on the entire surface of the wafer 110 for a passage-forming substrate (the protective film 200) with the adhesive layer 91 interposed therebetween, and thus the lead electrodes 90 is formed as being composed of the adhesive layer 91 and the metal layer 92. Thereafter, the lead electrodes 90 are subjected to patterning into predetermined shapes.

Figure 6B:
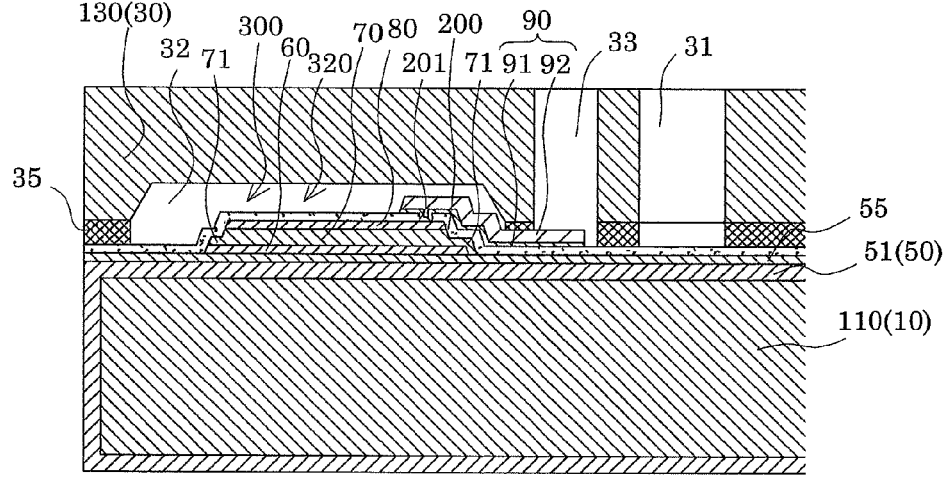

Next, as shown in FIG. 6B, a wafer 130 for a protective plate, which is a silicon wafer and is made into a plurality of protective plates 30, is joined, by use of the adhesive agent 35, onto a side of the wafer 110 for a passage-forming substrate, the side having the piezoelectric elements 300. Note that, since this wafer 130 for a protective plate has a thickness of, for example, about 400 µm, the rigidity of the passage-forming substrate is remarkably enhanced by joining thereon the wafer 130 for a protective plate.

Figure 6C:
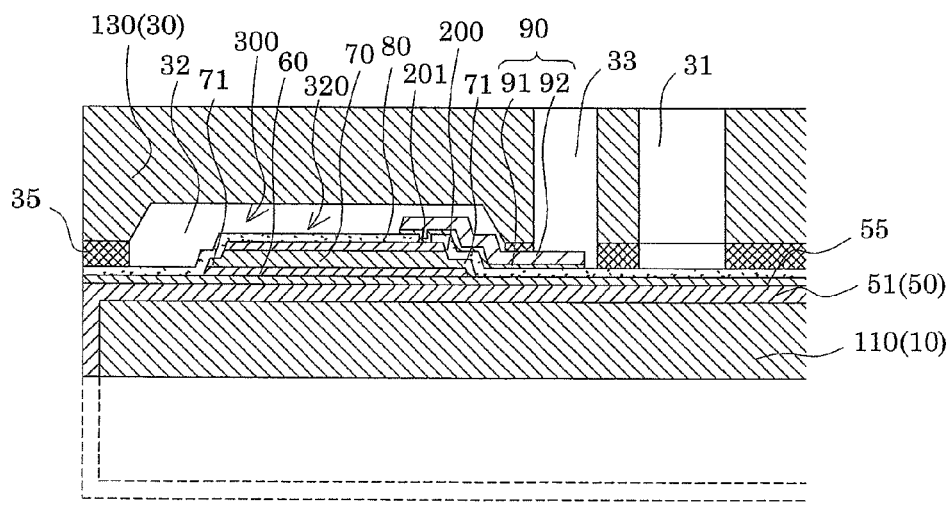

Next, as shown in FIG. 6C, the wafer 110 for a passage-forming substrate is formed into a predetermined thickness. To this end, the wafer 110 for a passage-forming substrate is polished until the wafer 110 has approximately a certain thickness, and then the wafer 110 thus polished is subjected to wet-etching by use of fluoric-nitric acid. For example, in this embodiment, the wafer 110 for a passage-forming substrate is subjected to the etching process so as to be formed in a thickness of about 70 µm.

Figure 7A:
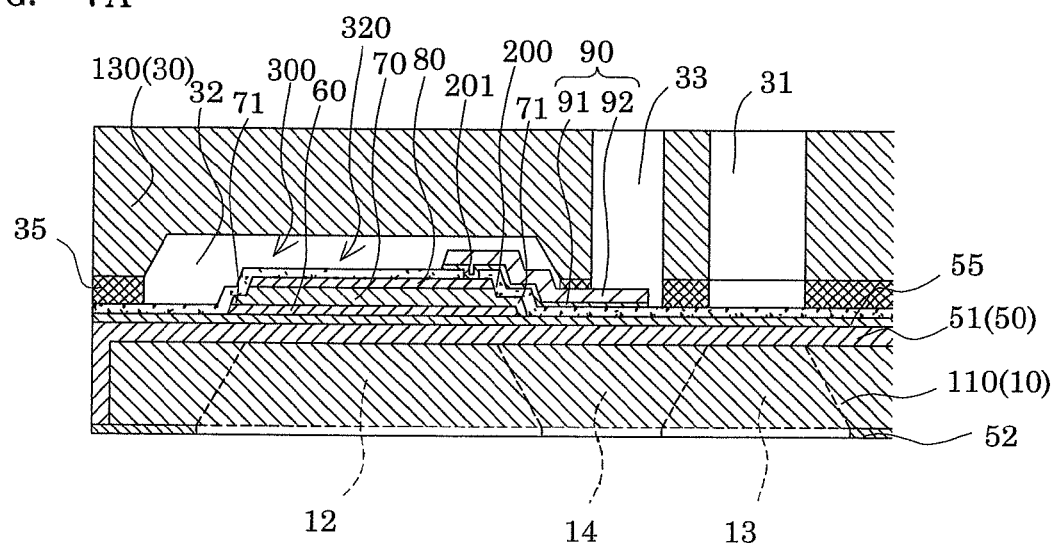
FIGS. 7A and 7B are a cross-sectional view showing a manufacturing process of the recoding head according to Embodiment 1.

Next, as shown in FIG. 7A, a mask film 52 made of, for example, silicon nitride (SiN) is newly formed on the wafer 110 for a passage-forming substrate, and is patterned into a predetermined shape.

Figure 7B:
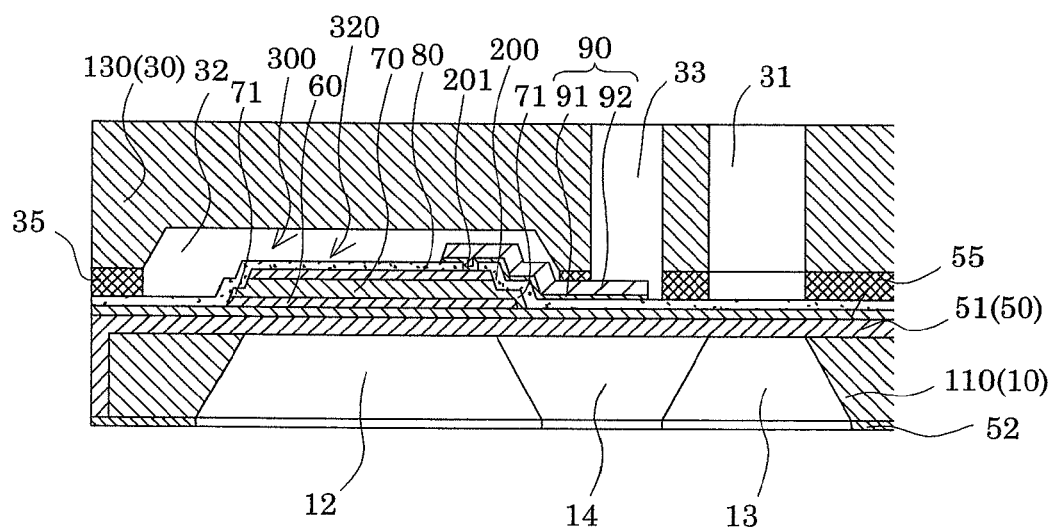

Subsequently, as shown in FIG. 7B, the pressure-generating chambers 12, the communicating portion 13, the ink supply paths 14 and the like, all of which correspond to the respective piezoelectric elements 300, are formed in the wafer 110 for a passage-forming substrate. To this end, the wafer 110 for a passage-forming substrate is subjected to an anisotropic-etching (wet-etching) through the mask film 52 using an alkaline solution such as KOH.

Then, after the mask film 52 is removed on the wafer 110 for a passage-forming substrate, unnecessary parts in outer peripheral edge portions of the wafer 110 for a passage-forming substrate and the wafer 130 for a protective plate are removed, for example, by cutting off the unnecessary parts by dicing or the like. Then, while the nozzle plate 20, with the nozzle orifices 20 drilled therein, is joined onto a surface of the wafer 110 for a passage-forming substrate, the surface being on the opposite side to the surface to which the wafer 130 for a protective plate is joined. The compliance plate 40 is joined to the protective plate wafer 130, and then the passage-forming substrate 110 and the like are divided into one-chip sized pieces each, as shown in FIG. 1, constituting the passage-forming substrate 10 and the like. Thereby, the ink-jet recording head of this embodiment is formed.

Embodiment 2

Figure 8A:
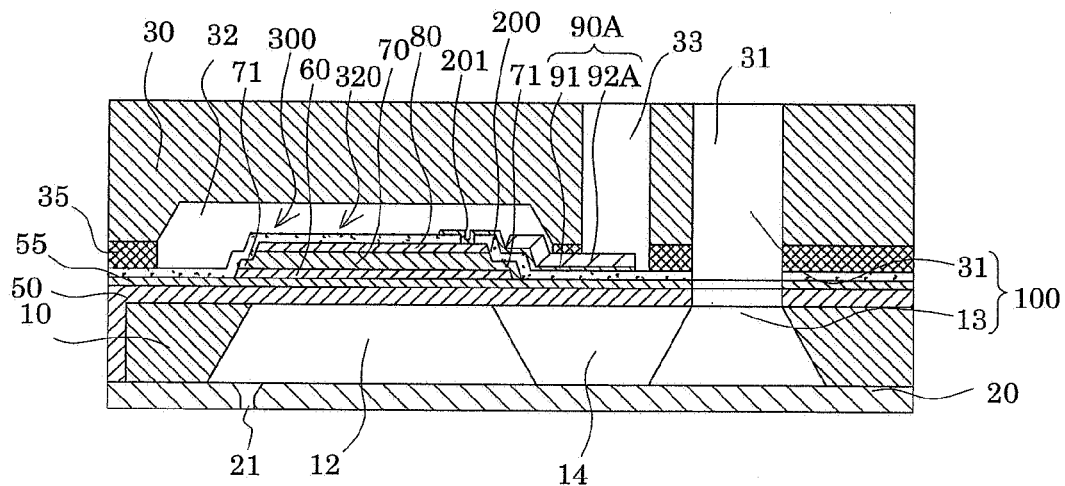
FIG. 8A is a cross-sectional view showing a manufacturing process of the recoding head according to Embodiment 2.
Figure 8B:
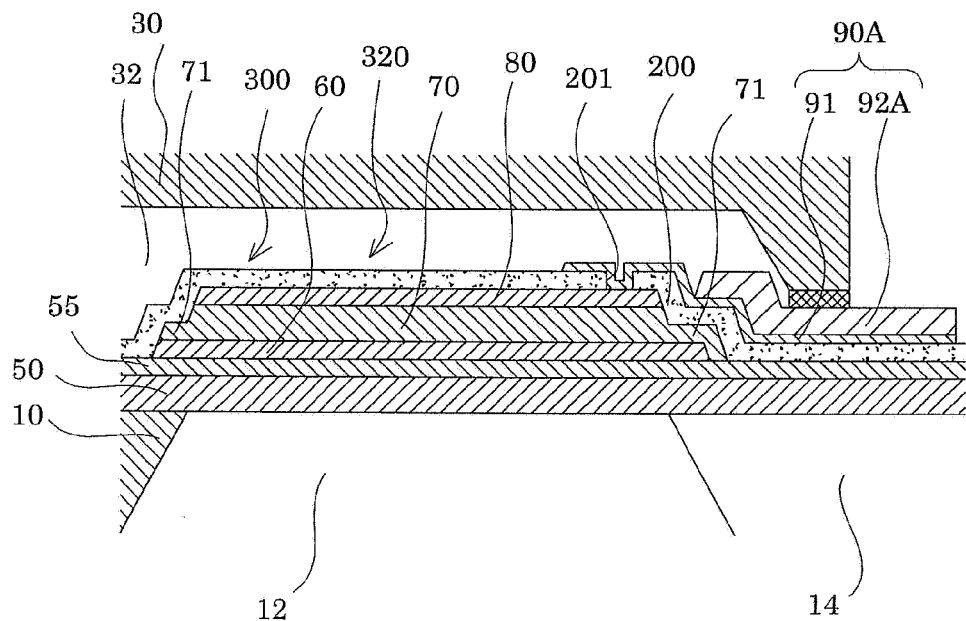
FIG. 8B is an enlarged cross-sectional view of a chief part in FIG. 8A.

FIGS. 8A and 8B are a cross-sectional view, and an enlarged view of a chief portion, respectively, of an ink-jet recoding head, which is an example of the liquid-jet head of the invention. Note that description will not be repeated by, instead, giving the same reference numerals to elements corresponding to those in FIG. 1.

As shown in FIGS. 8A and 8B, each of lead electrodes 90A is composed of an adhesive layer 91 and a metal layer 92A. The adhesive layer 91 extends to a region facing the corresponding ink supply path 14 from a region facing one end portion of the corresponding upper electrode film 80 on the protective film 200. Additionally, the metal layer 92A is provided, on the adhesive layer 91, in a region outside of a region facing the corresponding upper electrode film 80 on the adhesive layer 91. The region in which the metal layer 92A is provided is, in other words, a region outside of the corresponding piezoelectric active portion 320. Specifically, the metal layer 92A is provided from a region on the adhesive layer 91, the region facing the thin film portion 71, to a region facing the ink supply path 14.

By configuring the lead electrodes 90A in this manner, each of the upper electrode films 80 and the driver circuit 120 is reliably conducted electrically to each other through the lead electrodes 90A, and, at the same time, displacement of the piezoelectric active portions 320 are not inhibited by the lead electrodes 90A. Thereby, the piezoelectric elements 300 (the piezoelectric active portions 320) are made excellent in displacement characteristic.

Other Embodiments

While the embodiments of the invention have been described hereinabove, the basic configuration of the invention is not limited to Embodiments 1 and 2 described above.

For example, the thickness of the piezoelectric layer 70 in regions to be the piezoelectric active portions 320 is set to 1.1 μm in Embodiments 1 and 2 described above. The invention, however, is not particularly limited to this configuration. The piezoelectric layer 70 with any thickness, when the invention is applied thereto, can enhance driving durability of the piezoelectric elements 300, and thereby can enhance reliability thereof.

Figure 9:
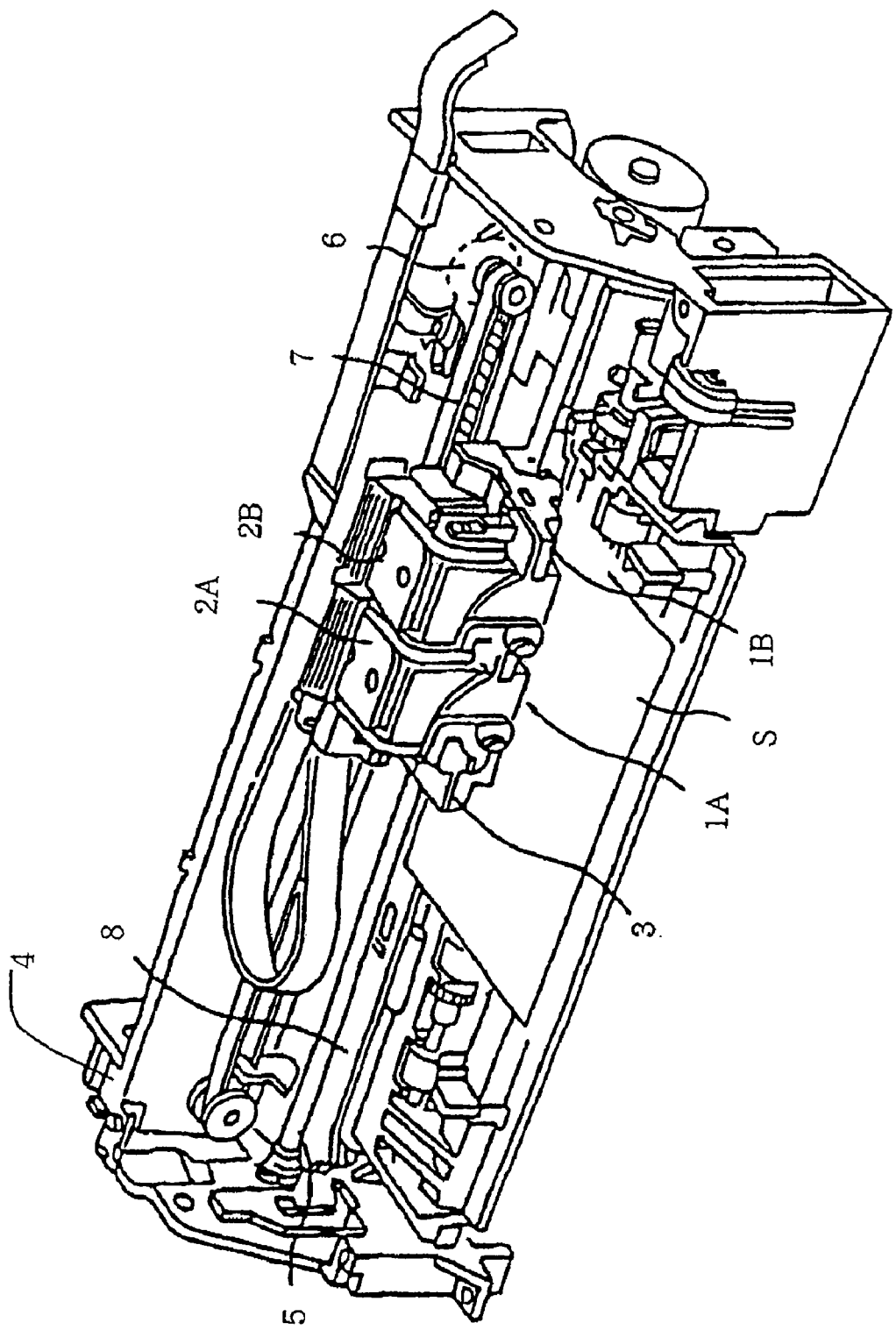
FIG. 9 is a schematic view of a recoding apparatus according to one embodiment of the invention.

Moreover, each of the ink-jet recording heads of these embodiments constitutes a part of the recording head unit provided with ink passages communicating with an ink cartridge and the like, and is mounted on an ink-jet recording apparatus. FIG. 9 is a schematic view showing an example of the ink-jet recoding apparatus. As shown in FIG. 6, a cartridge 2A and a cartridge 2B, which constitute ink supply means, are detachably provided respectively to recording head units 1A and 2A each including an ink-jet recording head. Additionally, a carriage 3 having the recording head units 1A and 1B mounted thereon is provided on a carriage shaft 5 fixed to an apparatus body 4, in a state freely movable along the axial direction of the carriage shaft 5. These recording head units 1A and 1B are, for example, configured to eject a black ink composition and a color ink composition, respectively. The driving force of a drive motor 6 is transmitted to the carriage 3 through a plurality of unillustrated gears and a timing belt 7. The carriage 3 having the recording head units 1A and 1B mounted thereon is thus moved along the carriage shaft 5. On the other hand, a platen 8 is provided along the carriage shaft 5 in the apparatus body 4, and a recording sheet S, which is a recording medium such as paper fed by an unillustrated feed roller or the like, is conveyed on the platen 8.

Furthermore, the above embodiments have been described by taking the ink-jet recording head as an example of a liquid-jet head. The invention, however, is broadly intended for liquid-jet heads in general. It is, for this reason, obviously possible to apply the invention to a liquid-jet head that ejects liquid other than ink. Examples of liquid-jet heads that eject liquid other than ink include: various recording heads used for image recording apparatuses such as a printer; a color material jet head used for manufacturing color filters of a liquid crystal display and the like; an electrode material jet head used for forming electrodes of an organic EL display, a field emission display (FED) and the like; a bio-organic matter jet head used for manufacturing biochips; and the like. Note that the invention can be applied not only to an actuator device mounted on a liquid-jet head (such as an ink-jet recording head) but also to actuator devices mounted on apparatuses of all kinds.

What is claimed is:

1. An actuator device comprising piezoelectric elements which are displaceably provided on a substrate, each of the piezoelectric elements being formed of a lower electrode, a piezoelectric layer and an upper electrode, wherein longitudinal end portions of the upper electrode define longitudinal end portions of a piezoelectric active portion to be a substantial driver of the piezoelectric element, the lower electrode and the piezoelectric layer are provided continuously to the longitudinal outside of the piezoelectric active portion, and regions of the piezoelectric layer outside of the piezoelectric active portion are formed to be thin film portions, thickness of which is thinner than thickness of the piezoelectric layer in a region to be the piezoelectric active portion.

2. The actuator device according to claim 1, wherein a plurality of the piezoelectric elements are provided side by side in the shorter-side direction of each piezoelectric element, the lower electrode is provided across the plurality of piezoelectric elements, and end portions of the upper electrode in the shorter-side direction define end portions of the piezoelectric active portion in the shorter-side direction.

3. The actuator device according to claim 1, wherein a protective film formed of an insulator covering, at least, the surfaces of the piezoelectric layer of the piezoelectric elements is provided.

4. The actuator device according to claim 1, wherein extension wiring through which a voltage is applied to each of the piezoelectric elements is provided on one longitudinal end portion of the corresponding upper electrode.

5. The actuator device according to claim 4, wherein the extension wiring is composed of:
an adhesive layer formed at the side of the upper electrode; and
a metal layer formed on the adhesive layer.

6. The actuator device according to claim 5, wherein,
the adhesive layer extends from one end portion of the upper electrode, and passes over the thin film portion until the adhesive layer reaches the substrate, and
the metal layer is formed, on the adhesive layer, in a region outside of a region facing the upper electrode.

7. The actuator device according to claim 4, wherein one side surface of the lower electrode is covered with the piezoelectric layer, the side surface being at the side of the extension wiring.

8. The actuator device according to claim 1, wherein each thin film portion has a thickness of not less than 0.1 μm.

9. The actuator device according to claim 1, wherein each thin film portion has a thickness of not more than 95% of the thickness of the piezoelectric layer.

10. A liquid-jet head comprising:
a passage-forming substrate on which pressure-generating chambers communicating with nozzle orifices which eject liquid are provided; and
the actuator device according to claim 1, provided on one of the sides of the passage-forming substrate, as liquid jetting means which causes liquid to be jetted from the nozzle orifices by generating a change in pressure in each of the pressure-generating chambers.

11. The liquid-jet head according to claim 10, wherein
the lower electrode is provided continuously to the outside of the pressure-generating chambers in the longitudinal direction of each of the pressure-generating chambers, and
the upper electrode is provided in a region facing the corresponding pressure-generating chamber in the longitudinal direction of each of the pressure-generating chambers.

12. A liquid-jet apparatus comprising the liquid-jet head according to claim 10.

* * * * *